(12) United States Patent
Wu et al.

(10) Patent No.: US 11,849,592 B2
(45) Date of Patent: Dec. 19, 2023

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Jia-Rong Wu, Kaohsiung (TW); I-Fan Chang, Tainan (TW); Rai-Min Huang, Taipei (TW); Ya-Huei Tsai, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/888,451

(22) Filed: Aug. 15, 2022

(65) Prior Publication Data

US 2022/0392954 A1 Dec. 8, 2022

Related U.S. Application Data

(63) Continuation of application No. 16/857,152, filed on Apr. 23, 2020, now Pat. No. 11,456,331.

(30) Foreign Application Priority Data

Mar. 30, 2020 (CN) .......................... 202010235266.X

(51) Int. Cl.
*H10B 61/00* (2023.01)
*G11C 11/16* (2006.01)
*H01F 10/32* (2006.01)
*H01F 41/34* (2006.01)
*H01L 23/522* (2006.01)
*H01L 23/528* (2006.01)
*H10N 50/01* (2023.01)
(Continued)

(52) U.S. Cl.
CPC ............ *H10B 61/00* (2023.02); *G11C 11/161* (2013.01); *H01F 10/3254* (2013.01); *H01F 41/34* (2013.01); *H01L 23/528* (2013.01); *H01L 23/5226* (2013.01); *H10N 50/01* (2023.02); *H10N 50/80* (2023.02); *H10N 50/85* (2023.02)

(58) Field of Classification Search
CPC ...... H10B 61/00; G11C 11/161; H10N 50/80; H10N 50/01; H01F 10/3254; H01F 41/34; H01L 23/528
USPC ....................................................... 257/421
See application file for complete search history.

(56) References Cited

U.S. PATENT DOCUMENTS 9,660,183 B2 * 5/2017 Wang ..................... H10N 50/01
10,002,905 B2 6/2018 Park et al.
(Continued)

FOREIGN PATENT DOCUMENTS

CN 109411503 A 3/2019
CN 110890460 A 3/2020
(Continued)

*Primary Examiner* — Jami Valentine Miller
(74) *Attorney, Agent, or Firm* — Winston Hsu

(57) ABSTRACT

A semiconductor device includes a substrate having a logic region and a magnetoresistive random access memory (MRAM) region, a MTJ on the MRAM region, a metal interconnection on the MTJ, and a blocking layer on the metal interconnection. Preferably, the blocking layer includes a stripe pattern according to a top view and the blocking layer could include metal or a dielectric layer.

9 Claims, 6 Drawing Sheets

(51) Int. Cl.
   *H10N 50/80*        (2023.01)
   *H10N 50/85*        (2023.01)

(56) References Cited

U.S. PATENT DOCUMENTS

| | | | |
|---|---|---|---|
| 2009/0085132 A1* | 4/2009 | Kao | B82Y 10/00 |
| | | | 257/E29.323 |
| 2010/0102407 A1 | 4/2010 | Kajiyama | |
| 2014/0328116 A1 | 11/2014 | Guo | |
| 2018/0158498 A1 | 6/2018 | Aggarwal | |
| 2019/0206928 A1 | 7/2019 | Li | |
| 2019/0378971 A1 | 12/2019 | Chu | |
| 2020/0083428 A1 | 3/2020 | Weng | |
| 2022/0045125 A1* | 2/2022 | Kimura | G06N 3/065 |

FOREIGN PATENT DOCUMENTS

| | | |
|---|---|---|
| JP | 2006-253303 A | 9/2006 |
| JP | 2013-201343 A | 10/2013 |

* cited by examiner

MAGNETORESISTIVE RANDOM ACCESS MEMORY AND METHOD FOR FABRICATING THE SAME

CROSS REFERENCE TO RELATED APPLICATIONS

This application is a continuation application of U.S. application Ser. No. 16/857,152, filed on Apr. 23, 2020. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate having a logic region and a magnetoresistive random access memory (MRAM) region, a MTJ on the MRAM region, a metal interconnection on the MTJ, and a blocking layer on the metal interconnection. Preferably, the blocking layer includes a stripe pattern according to a top view and the blocking layer could include metal or a dielectric layer.

According to another aspect of the present invention, a semiconductor device includes a substrate having a logic region and a magnetoresistive random access memory (MRAM) region, a MTJ on the MRAM region, a metal interconnection on the MTJ, and a blocking layer on the metal interconnection. Preferably, the blocking layer includes a grid line pattern according to a top view and the blocking layer could include metal or a dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
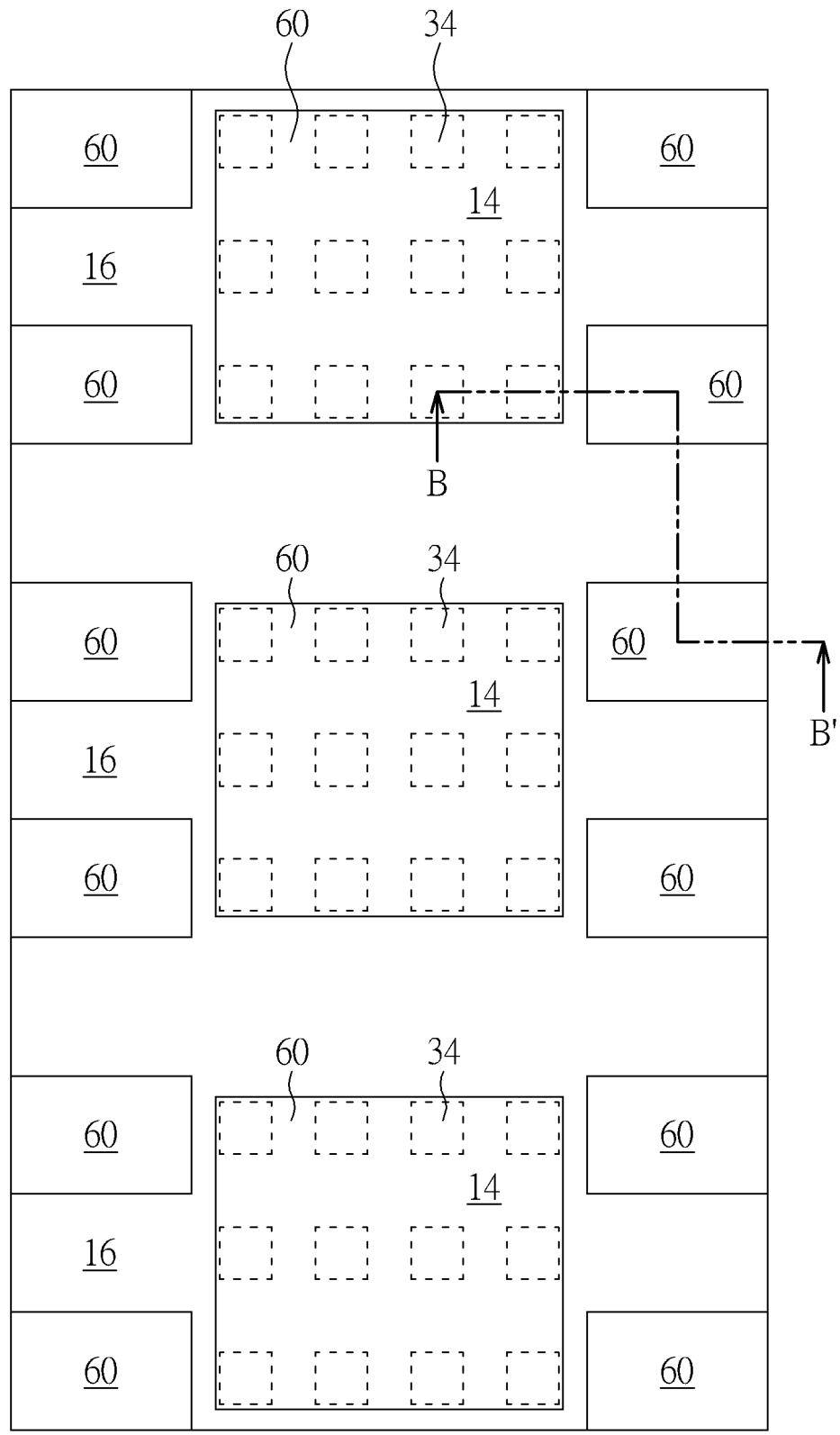
FIG. 1 illustrates a top view for fabricating a MRAM unit according to an embodiment of the present invention.
Figure 2:
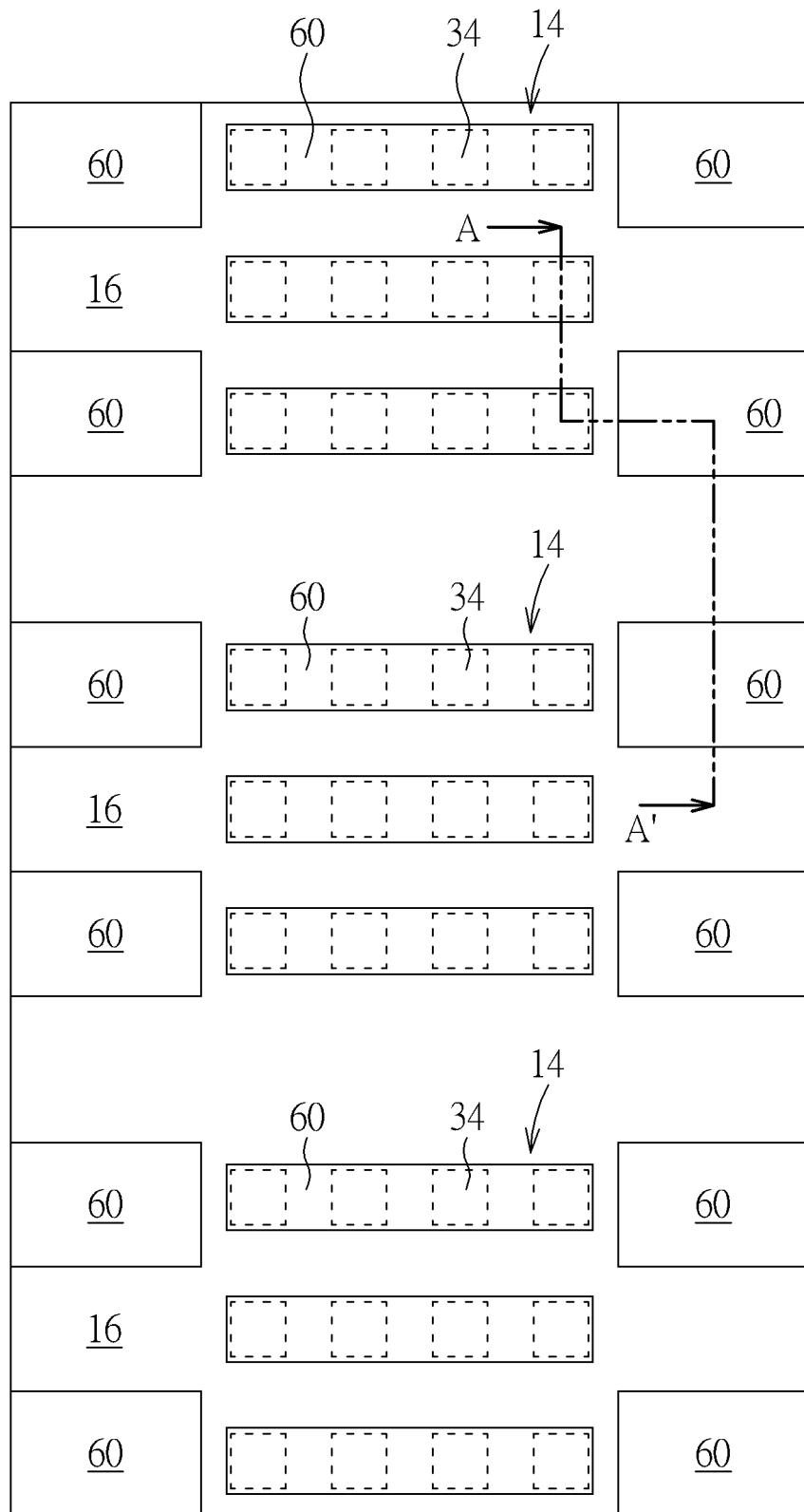
FIG. 2 illustrates a top view for fabricating a MRAM unit according to an embodiment of the present invention.
Figure 3:
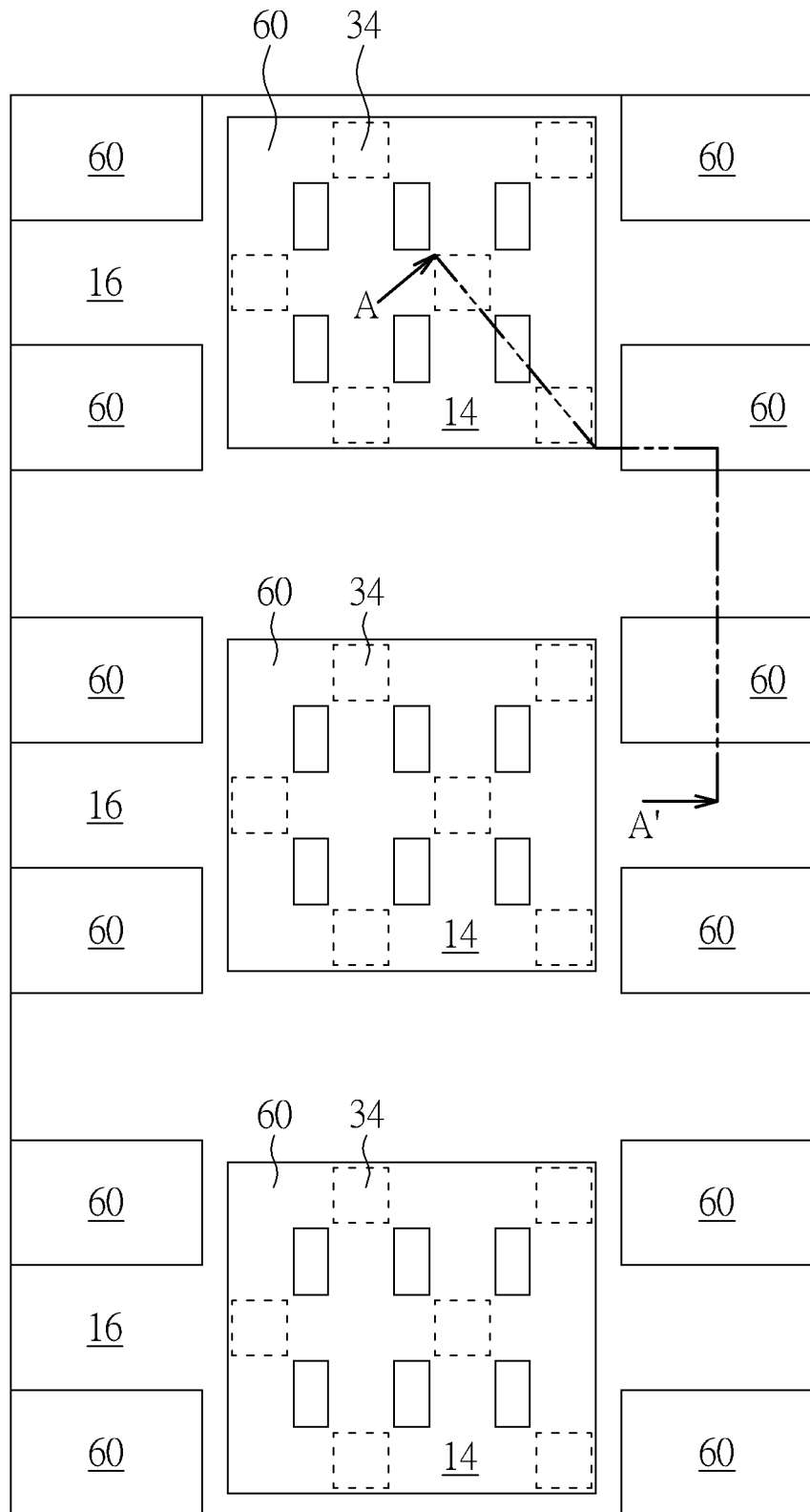
FIG. 3 illustrates a top view for fabricating a MRAM unit according to an embodiment of the present invention.
Figure 4:
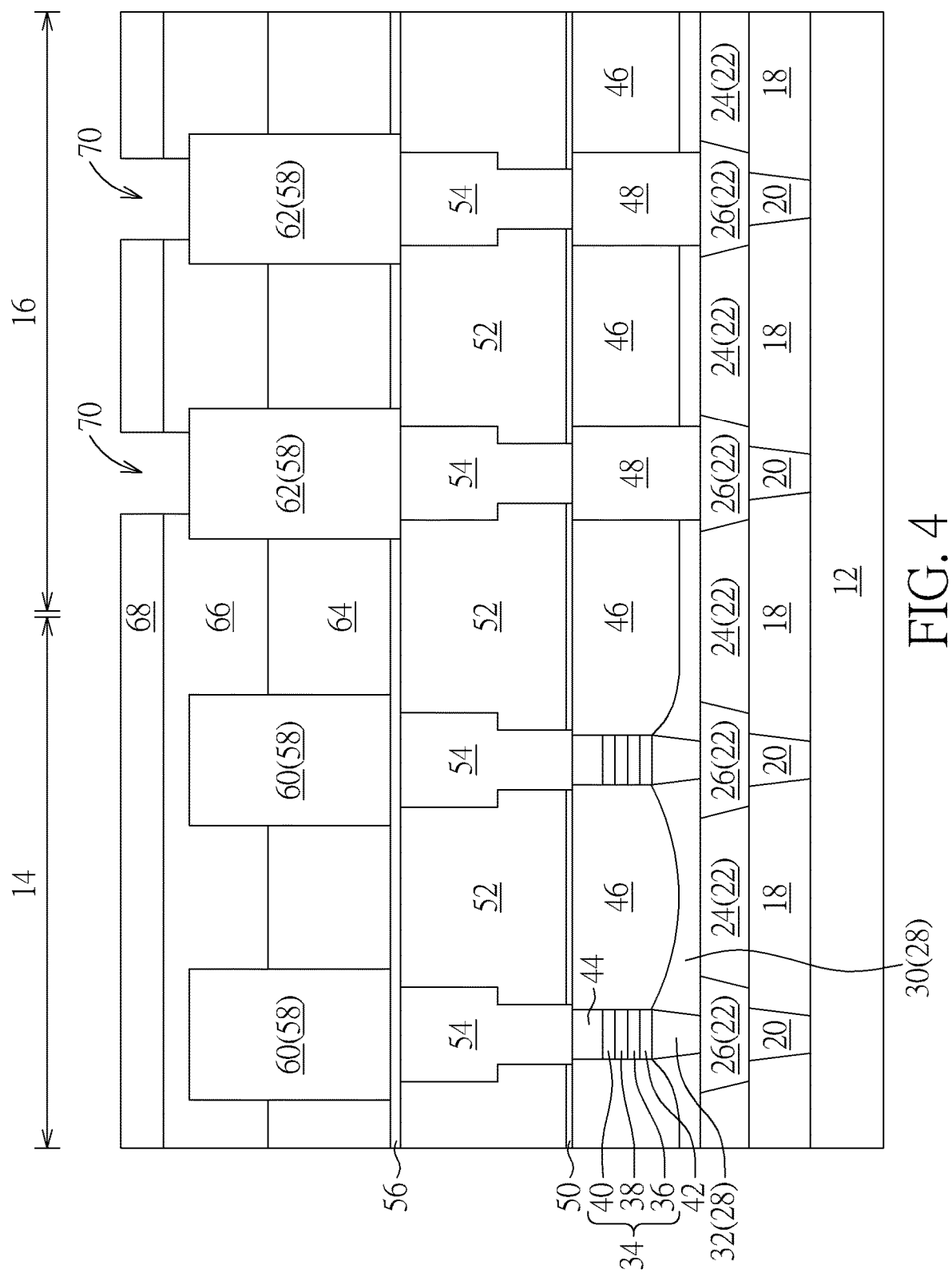
FIG. 4 illustrates a cross-section view taken along the sectional line AA' of FIGS. 2-3.
Figure 5:
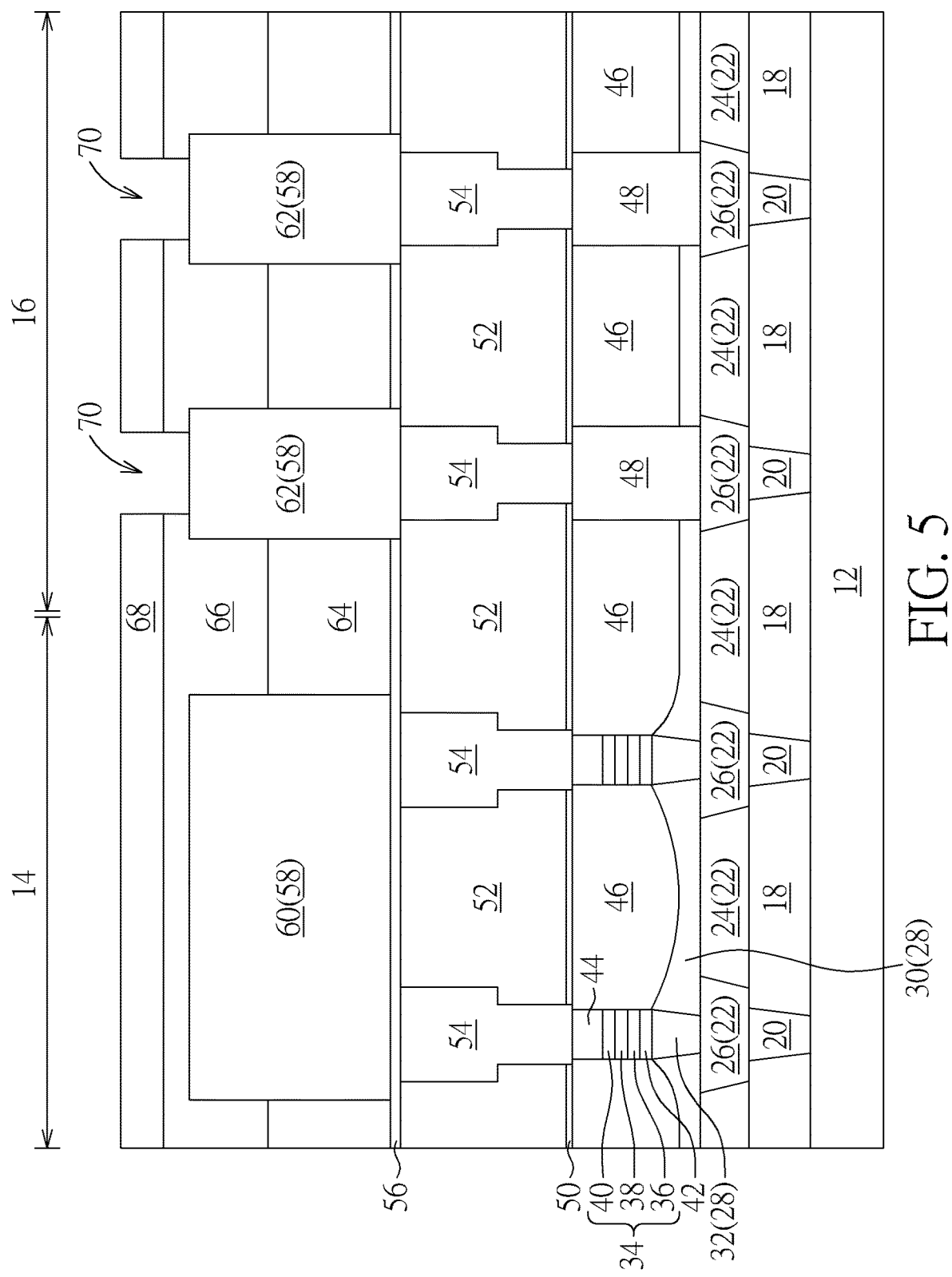
FIG. 5 illustrates a cross-section view taken along the sectional line BB' of FIG. 1.

Referring to FIGS. 1-5, FIGS. 1-3 illustrate a method for fabricating a semiconductor device, or more particularly a MRAM device according to different embodiments of the present invention, FIG. 4 illustrates a cross-section view taken along the sectional line AA' of FIGS. 2-3, and FIG. 5 illustrates a cross-section view taken along the sectional line BB' of FIG. 1. As shown in FIGS. 1-5, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures 20 (for example metal gates) and source/drain regions, spacers, epitaxial layers, and contact etch stop layer (CESL). The ILD layer 18 could be formed on the substrate 12 to cover the MOS transistors, and a plurality of contact plugs 20 could be formed in the ILD layer 18 to electrically connect to the gate structures and/or source/drain regions of MOS transistors. Since the fabrication of planar or non-planar transistors and ILD layer 18 is well known to those skilled in the art, the details of which are not explained herein for the sake of brevity.

Next, metal interconnect structures 22, 28 are sequentially formed on the ILD layer 18 on the MRAM region 14 and the logic region 16 to electrically connect the aforementioned contact plugs 20, in which the metal interconnect structure 22 includes a stop layer (not shown) disposed on the ILD layer 18, an inter-metal dielectric (IMD) layer 24, and metal interconnections 26 embedded in the IMD layer 24, and the metal interconnect structure 28 includes a stop layer (not shown), an IMD layer 30, and metal interconnections 32 embedded in the stop layer and the IMD layer 30.

In this embodiment, each of the metal interconnections 26 from the metal interconnect structure 22 preferably includes a trench conductor and each of the metal interconnections 32 from the metal interconnect structure 28 on the MRAM region 14 includes a via conductor. Preferably, each of the metal interconnections 26, 32 from the metal interconnect structures 22, 28 could be embedded within the IMD layers 24, 30 and/or stop layer according to a single damascene process or dual damascene process. For instance, each of the metal interconnections 26, 32 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal interconnections 26 are preferably made of copper, the metal interconnections 32 are made of tungsten (W), the IMD layers 24, 30 are preferably made of silicon oxide, and the stop layers are preferably made of nitrogen doped carbide (NDC), silicon nitride, silicon carbon nitride (SiCN), or combination thereof.

Next, a MTJ stack (not shown) or stack structure is formed on the metal interconnect structure 28 and one or more etching process is conducted to remove part of the MTJ stack for forming a plurality of MTJs such as MTJs 34 on the MRAM region 14. It should be noted that a reactive ion etching (RIE) process and/or an ion beam etching (IBE) process could be conducted to remove part of the MTJ stack and even part of the IMD layer 30 for forming the MTJs 34. Due to the characteristics of the IBE process, the top surface of the remaining IMD layer 30 is slightly lower than the top surface of the metal interconnections 32 after the IBE process and the top surface of the IMD layer 30 also reveals a curve or an arc.

In this embodiment, each of the MTJs 34 preferably include a pinned layer 36, a barrier layer 38, and a free layer, 40, in which a bottom electrode 42 is disposed under each of the MTJs 34 and a top electrode 44 is disposed on top of each of the MTJs 34. Preferably, the bottom electrode layer 42 and the top electrode layer 44 are preferably made of conductive material including but not limited to for example Ta, Pt, Cu, Au, Al, or combination thereof. The pinned layer 36 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 36 is formed to fix or limit the direction of magnetic moment of adjacent layers. The barrier layer 38 could be made of insulating material including but not limited to for example oxides such as aluminum oxide (AlO$_x$) or magnesium oxide (MgO). The free layer 40 could be made of ferromagnetic material including but not limited to for example iron, cobalt, nickel, or alloys thereof such as cobalt-iron-boron (CoFeB), in which the magnetized direction of the free layer 40 could be altered freely depending on the influence of outside magnetic field.

Next, a cap layer (not shown) and an IMD layer 46 are formed on the MTJs to cover the surface of the IMD layer 30, and a planarizing process such as chemical mechanical polishing (CMP) process is conducted to remove part of the IMD layer 46 so that the top surfaces of the remaining cap layer, the IMD layer 46, and the top electrodes 44 are coplanar. Next, a photo-etching process is conducted remove part of the IMD layer 46 on the logic region 16 to form contact holes, and conductive materials are deposited into the contact holes accompanied by a planarizing process to form metal interconnections 48 electrically connecting the metal interconnections 26 underneath. In this embodiment, the cap layer preferably includes silicon nitride but could also include other dielectric materials including but not limited to for example silicon oxide, silicon oxynitride (SiON), or silicon carbon nitride (SiCN). The IMD layer 46 preferably includes an ultra low-k (ULK) dielectric layer such as porous dielectric materials including but not limited to for example silicon oxycarbide (SiOC).

Next, a stop layer 50 and another IMD layer 52 are formed on the MTJs 34 to cover the surfaces of the cap layer and the IMD layer 46, and one or more photo-etching process is conducted to remove part of the IMD layer 52 and part of the stop layer 50 on the MRAM region 14 and logic region 16 to form contact holes (not shown). Next, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form metal interconnections 54 connecting the top electrodes 44 on the MRAM region 14 and metal interconnections 48 on the logic region 16.

Next, another stop layer 56 is formed on the IMD layer 52 to cover the metal interconnections 54, and a photo-etching process is conducted to form part of the stop layer 56 on the logic region 16 to form an opening (not shown) exposing the metal interconnections 54 underneath, a material layer 58 is formed on the stop layer 56 to fill the opening, and then another photo-etching process is conducted to pattern the material layer 58 for forming patterned material layer 58 on the MRAM region 14 and logic region 16, in which the material layer 58 on the MRAM region 14 preferably serves as a blocking layer 60 while the material layer 58 on the logic region 16 serves as contact pads 62. In this embodiment, the material layer 58 or blocking layer 60 is preferably made of conductive material or metal such as aluminum (Al). Since the blocking layer 60 and metal interconnections 54 on the MRAM region 14 are separated by the stop layer 56 while the material layer 58 on the logic region 16 contacts the metal interconnections 54 underneath, the blocking layer 60 on the MRAM region 14 is preferably not connected to the MTJs 34 underneath.

It should be noted that the blocking layer 60 if viewed from a top view perspective could include different shapes covering the MTJs 34 underneath. For instance, the blocking layer 60 is shown to cover the entire MRAM region 14 in FIG. 1, the blocking layer 60 is shown as stripe patterns to cover the MTJs in FIG. 2, and the blocking layer 60 is shown as check or grid line patterns to cover the MTJs in FIG. 3. Moreover, the blocking layer 60 is viewed from a cross-section perspective could be disposing on each of the MTJs 34 individually as shown in FIG. 4 or overlapping a plurality of MTJs 34 as shown in FIG. 5, in which the blocking layer 60 preferably not electrically connecting the metal interconnections 54 and/or MTJs 34 underneath, which are all within the scope of the present invention.

Next, a plurality of dielectric layers such as dielectric layers 64, 66, 68 are formed on the stop layer 56 on both MRAM region 14 and logic region 16 and covering the blocking layer 60, a photo-etching process is conducted to remove part of the dielectric layers 66, 68 to form openings 70, a high pressure anneal process is selectively conducted by using hydrogen gas under an environment of 400° C. to adjust the entire structure, and then a wire bonding process could be conducted to form wire bonds in the openings 70 for connecting the external circuits. In this embodiment, the dielectric layer 64 could include silicon oxide, silicon nitride, silicon oxynitride, or ultra low-k dielectric material, the dielectric layer 66 preferably includes silicon oxide, and the dielectric layer 68 preferably includes silicon nitride. This completes the fabrication of a semiconductor device according to an embodiment of the present invention.

Figure 6:
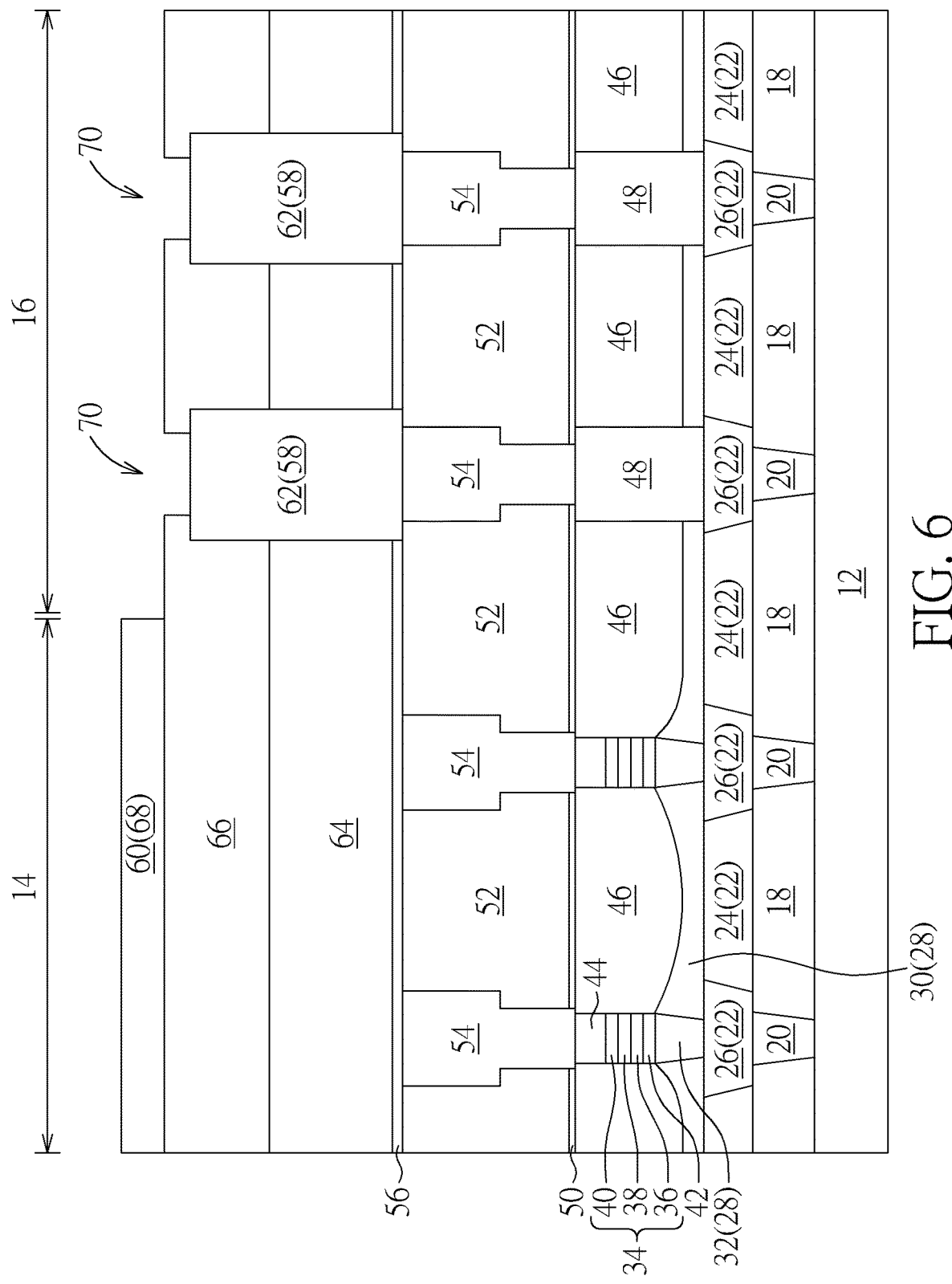
FIG. 6 illustrates a structural view of a semiconductor device according to an embodiment of the present invention.

Referring to FIG. 6, FIG. 6 further illustrates a structural view of a semiconductor device according to an embodiment of the present invention. As shown in FIG. 6, in contrast to the aforementioned embodiment of forming metal on the MRAM region 14 to form the blocking layer 60 for shielding the MTJs 34 underneath, it would also be desirable to omit the step of forming the metal blocking layer 60 on the MRAM region 16 by forming a blocking layer 60 made of dielectric material for shielding the MTJs 34 underneath. For instance, it would be desirable to first follow the fabrication process in FIG. 4 by forming a material layer 58 made of metal on the stop layer 56, conducting a photo-etching process to pattern the material layer 58 by forming patterned material layer 58 as contact pads 62 on the logic region 16 but not forming any patterned material layer 58 on the MRAM region 14, and then forming dielectric layers 64, 66, 68 on the stop layer 56 on MRAM region 14 and logic region 16 while covering the material layer 58 on the logic region 16. Next, a photo-etching process is conducted to remove part of the dielectric layers 66, 68 on the logic region 16 for forming openings 70, another photo-etching process is conducted to remove all of the dielectric layer 68 on the logic region 16, and then forming wire bonds in the openings 70 to connect to external circuits.

It should be noted that in contrast to the topmost dielectric layer 68 in the aforementioned embodiment is made of silicon nitride, the blocking layer 60 or dielectric layer 68 in this embodiment is preferably made of dielectric material capable of insulating hydrogen gas such as silicon carbide (SiC), silicon carbon nitride (SiCN), and/or silicon carbo-oxynitride (SiCON). Moreover, in contrast to maintaining the topmost dielectric layer 68 during the formation of the openings 70 on the logic region 16 in the aforementioned embodiment, it would be desirable to conduct an additional photo-etching process to remove all of the dielectric layer 68 on the logic region 16 after forming the openings 70, which is also within the scope of the present invention.

Typically, a high pressure anneal process is employed to adjust the entire fabricated structure during the back-end-of-the-line (BEOL) stage of the fabrication such as during the formation of metal interconnections and reacting gas such as hydrogen gas in most circumstances would affect the magnetic performance of the MTJ underneath the metal interconnection or in extreme cases resulting in failure of the device. To resolve this issue the present invention preferably forms a blocking layer made of metal or dielectric material atop the MTJ on the MRAM region to block or insulate the penetration of hydrogen gas, in which the blocking layer preferably not contacting the metal interconnection above the MTJ or MTJs directly. Preferably, the blocking layer could include different patterns if viewed from a top view perspective. For instance, the blocking layer 60 is shown to cover the entire MRAM region 14 in FIG. 1, the blocking layer 60 is shown as stripe patterns to cover the MTJs in FIG. 2, and the blocking layer 60 is shown as check or grid line patterns to cover the MTJs in FIG. 3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a logic region and a magnetoresistive random access memory (MRAM) region;
   a MTJ on the MRAM region;
   a metal interconnection on the MTJ; and
   a blocking layer on the metal interconnection, wherein the blocking layer comprises a grid line pattern according to a top view.

2. The semiconductor device of claim 1, further comprising:
   a first dielectric layer on the blocking layer; and
   a second dielectric layer on the first dielectric layer.

3. The semiconductor device of claim 2, wherein the first dielectric layer comprises silicon oxide.

4. The semiconductor device of claim 1, wherein the blocking layer comprises metal.

5. The semiconductor device of claim 4, wherein the blocking layer comprises aluminum.

6. The semiconductor device of claim 1, further comprising:
   a first dielectric layer on the metal interconnection; and
   the blocking layer on the first dielectric layer.

7. The semiconductor device of claim 6, wherein the first dielectric layer comprises silicon oxide.

8. The semiconductor device of claim 6, wherein the blocking layer comprises a second dielectric layer.

9. The semiconductor device of claim 8, wherein the blocking layer comprises silicon carbide, silicon carbon nitride (SiCN), or silicon carbo-oxynitride (SiCON).

* * * * *